(12) United States Patent
Hikita et al.

(10) Patent No.: US 6,897,091 B2
(45) Date of Patent: May 24, 2005

(54) SEMICONDUCTOR DEVICE AND MANUFACTURING METHOD THEREOF

(75) Inventors: Junichi Hikita, Kyoto (JP); Yoshikazu Nakagawa, Kyoto (JP); Nobuhisa Kumamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/145,892

(22) Filed: May 16, 2002

(65) Prior Publication Data

US 2002/0127777 A1 Sep. 12, 2002

Related U.S. Application Data

(62) Division of application No. 09/497,157, filed on Feb. 3, 2000, now Pat. No. 6,404,040.

(30) Foreign Application Priority Data

Feb. 3, 1999 (JP) ............................................. 11-025910

(51) Int. Cl.$^7$ ............................................... H01L 21/44
(52) U.S. Cl. ........................................ 438/108; 438/109

(58) Field of Search ................................. 438/108–109, 438/113; 257/48, 620, 630

(56) References Cited

U.S. PATENT DOCUMENTS

| 5,739,546 A | 4/1998 | Saitou et al. ............... 257/620 |
| 5,834,829 A | 11/1998 | Dinkel et al. ............... 257/620 |

FOREIGN PATENT DOCUMENTS

| JP | 4-99537 | 8/1992 |
| JP | 7-212169 | 8/1995 |
| JP | 7-326797 | 12/1995 |
| JP | 9-266210 | 10/1997 |

*Primary Examiner*—David S. Blum
(74) *Attorney, Agent, or Firm*—Rabin & Berdo, P.C.

(57) ABSTRACT

A semiconductor device having a metal layer at the peripheral area surrounding an element forming area formed on a semiconductor substrate. This metal layer may be connected to the grounding potential or the power potential. The peripheral area is a scribing line area for example. The metal layer may be formed simultaneously with the formation of a bump within the element forming area.

5 Claims, 8 Drawing Sheets

SEMICONDUCTOR DEVICE AND MANUFACTURING METHOD THEREOF

This application is a divisional of Patent Application No. 09/497,157 filed Feb. 3, 2000 now 6,404,040.

BACKGROUND OF THE INVENTION

1. Field of the Invention

The present invention relates to a semiconductor device formed with the use of the peripheral areas (in particular, scribing line areas) of element forming areas, and also to a manufacturing method of such a semiconductor device.

2. Description of Related Art

When forming semiconductor chips on a wafer, there are formed, around the chips, areas where no elements are formed. These areas serve as allowances to be cut when the chips are cut from the wafer, and are called scribing lines.

Conventionally, such scribing lines are utilized merely as chip cutting allowances.

On the other hand, for disposing bump electrodes or bonding electrodes on a chip, it is required to dispose the electrodes so as to prevent the wirings among the electrodes from getting complicated. This lowers the degree of freedom for the arrangement of the electrodes. This disadvantageously imposes restrictions on the miniaturization and high integration of chips.

SUMMARY OF THE INVENTION

It is an object of the present invention to provide a semiconductor device formed with the use of the peripheral areas around element forming areas.

More specifically, it is an object of the present invention to provide a semiconductor device formed with the scribing line areas utilized for disposing electrodes or wirings, thus not only facilitating the connection among the electrodes on the semiconductor elements, but also improving the degree of freedom for wiring.

It is another object of the present invention to provide a method of manufacturing a semiconductor device with the use of the peripheral areas around element forming areas.

It is a further object of the present invention to provide a semiconductor device having a chip-on-chip structure in which there are piled up, on each other, semiconductor elements each formed with the use of the peripheral areas around element forming areas.

A semiconductor device according to the present invention comprises: a semiconductor substrate; an element forming area provided on the semiconductor substrate; a peripheral area surrounding, on the semiconductor substrate, the element forming area; and a metal layer formed at the peripheral area.

According to the arrangement above-mentioned, when the metal layer is for example connected to a predetermined electrode of the semiconductor substrate, this metal layer can be utilized as an electrode or a wiring.

For example, the metal layer may be connected to the grounding potential. This arrangement produces a shielding effect. Further, when this metal layer is utilized as the grounding line, an electrode inside of the element forming area can readily be grounded.

The metal layer may be connected to the power potential. According to this arrangement, the power can readily be fed to an electrode inside of the element forming area. In this case, too, the shielding effect is obtained.

The metal layer may be formed as surrounding the whole periphery of the element forming area. This produces an excellent shielding effect.

The metal layer may be divided into at least two portions. In this case, the divided portions can be utilized as electrodes or wirings different in potential from each other.

The peripheral area may be a scribing line area.

The metal layer may be a bump (projecting electrode). The bump has characteristics of low resistance and high thermal conductivity. In view of these characteristics, when the bump is connected to a predetermined electrode on the semiconductor element, this bump can more suitably be utilized as an electrode.

The metal layer may be formed simultaneously with the formation of a surface electrode (e.g., bump) within the element forming area at a step of forming this surface electrode. This enables the metal layer to be formed with no addition of a special step.

A diffusion layer is preferably formed on the semiconductor substrate immediately below the metal layer. More specifically, the diffusion layer may be formed for example at the scribing line area, and the bump may be formed on the diffusion layer. Dependent on the conduction types of both the diffusion layer and the semiconductor substrate, there is assured either ohmic contact with the semiconductor substrate, or insulation therefrom.

The metal layer may be formed in the scribing line area at other area than the cutting area. This makes it easier to cut a large semiconductor substrate (wafer) into individual semiconductor elements.

The metal layer may be connected, through a connection metal layer, to a surface electrode formed within the element forming area. This connection metal layer may simultaneously be formed at the time when the surface electrode (e.g., bump) is formed. When the connection metal layer is formed in the form of a bump, a large electric current can advantageously flow.

Preferably, the semiconductor device of the present invention further comprises a lateral-wall metal layer which covers the lateral walls of the semiconductor substrate. This lateral-wall metal layer is preferably connected to the metal layer formed at the peripheral area. In this case, when the metal layer at the peripheral area is utilized as the grounding line or the power line, the lateral sides of the semiconductor element,can also be shielded.

Preferably, the semiconductor device of the present invention further comprises a back-face metal layer which covers the back face of the semiconductor substrate. This makes it possible to expect a further improvement in shielding effect.

A semiconductor device manufacturing method of the present invention comprises: a step of providing a plurality of element forming areas on a semiconductor substrate; a step of forming a metal layer at scribing line areas between adjacent element forming areas; and a step of cutting the semiconductor substrate along the cutting areas in the scribing line areas.

The metal-layer forming step may be arranged such that the metal layer is formed at other areas of the scribing line areas than the cutting areas.

Preferably, the metal-layer forming step is conducted simultaneously with a step of forming surface electrodes within the element forming areas.

These and other features, objects and advantages of the present invention will be more fully apparent from the following detailed description set forth below when taken in conjunction with the accompanying drawings.

Figure 3A:
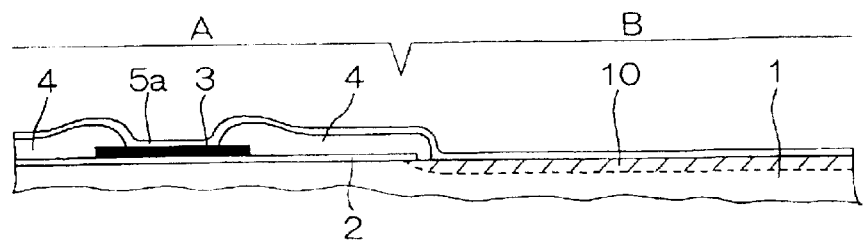
Figure 3B:
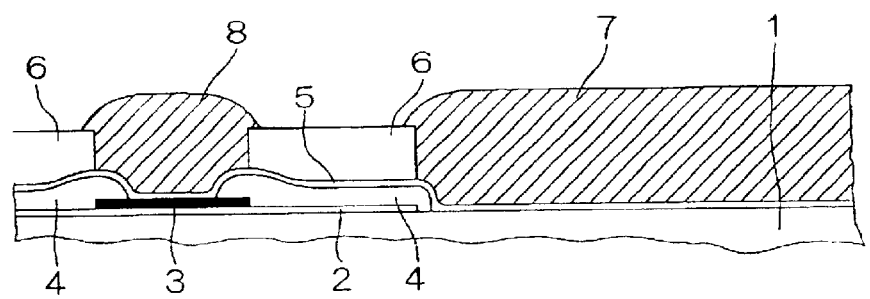
Figure 3C:
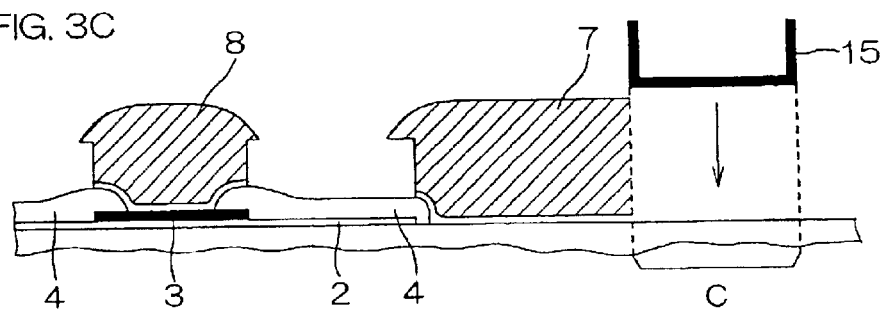
Figure 4A:
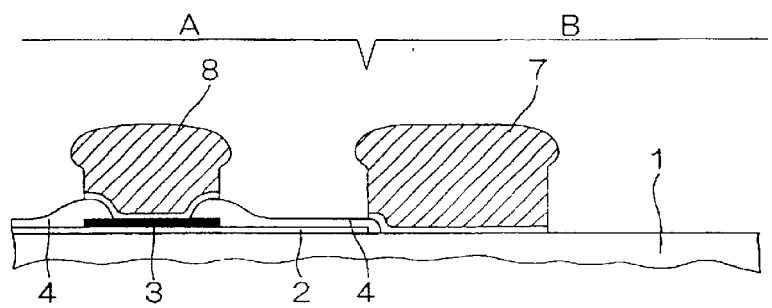
Figure 4B:
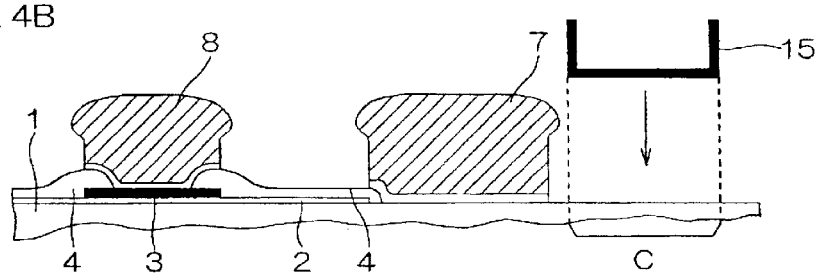
Figure 5:
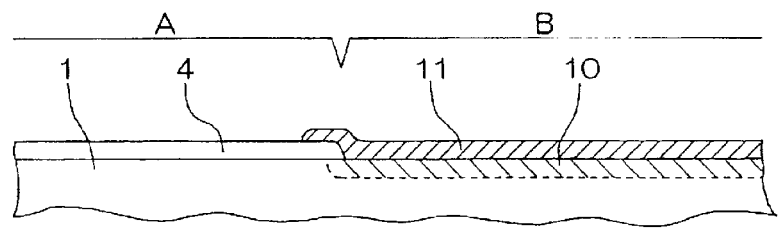
Figure 6A:
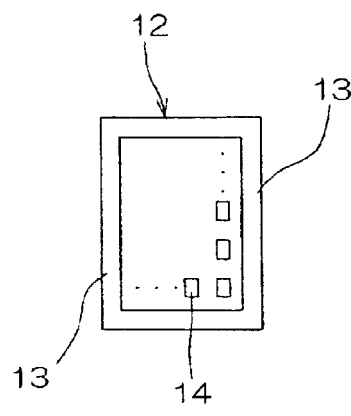
Figure 6B:
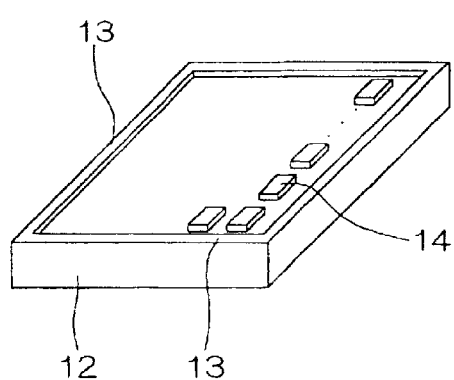
Figure 7:
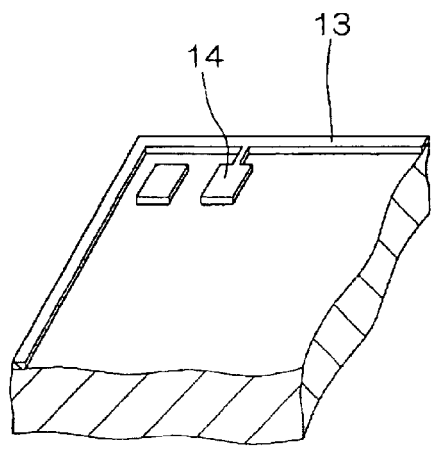
Figure 8:
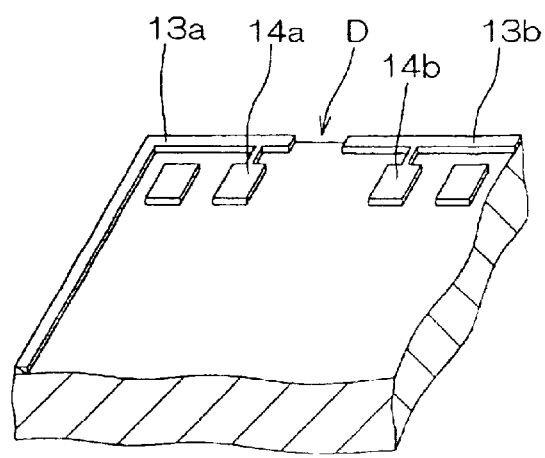
Figure 9A:
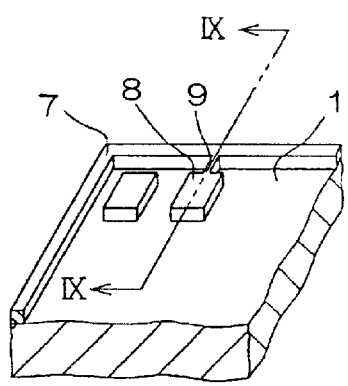
Figure 9B:
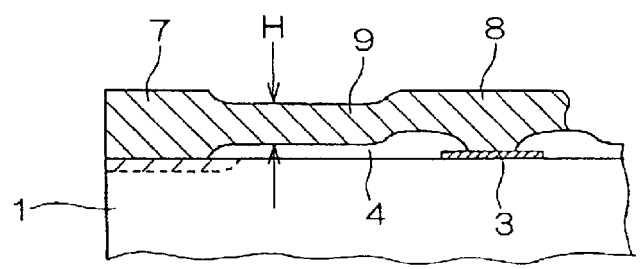
Figure 9C:
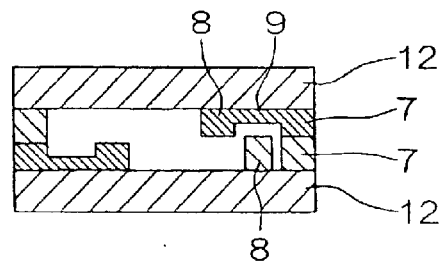
Figure 10A:
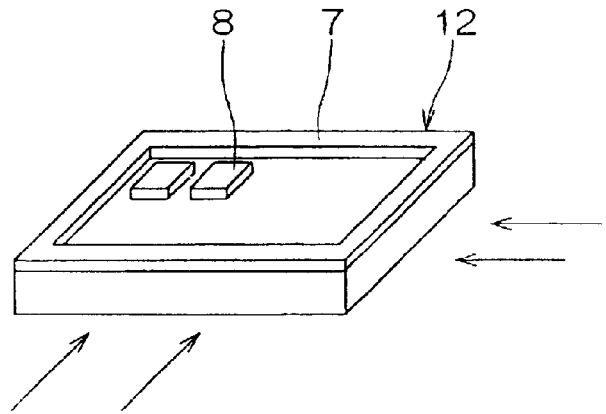
Figure 10B:
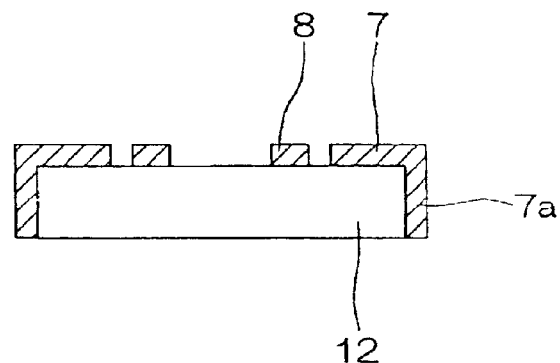
Figure 11:
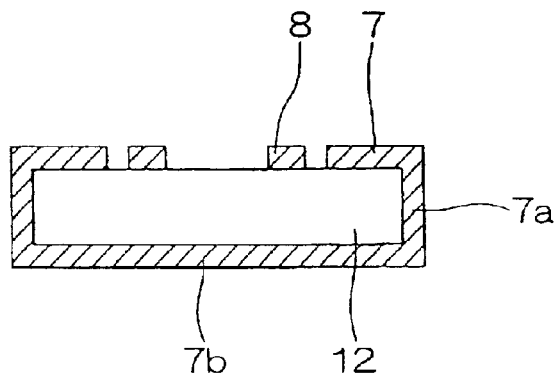
Figure 12A:
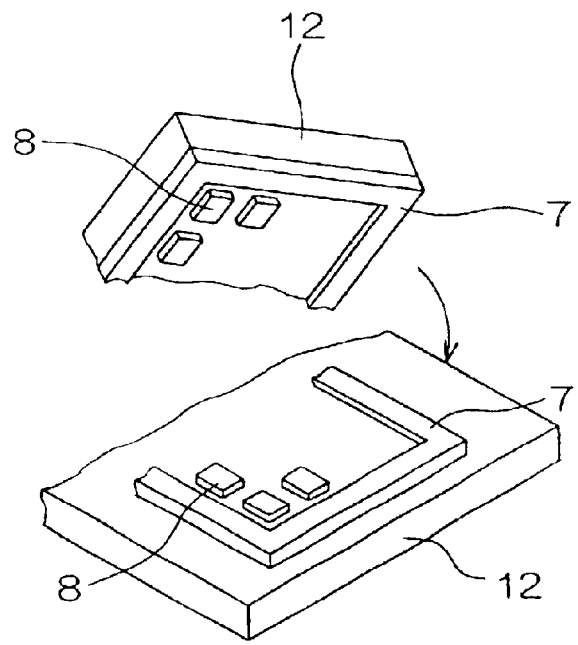
Figure 12B:
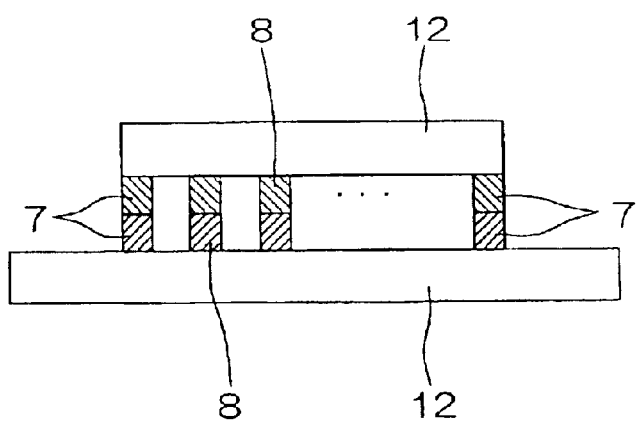

Each of FIG. 2A to FIG. 2F is a section view of an element forming area at its peripheral portion for illustrating a bump forming step;

Each of FIG. 3A to FIG. 3C is a section view of a production step which adopts electroless plating for forming bumps;

Each of FIG. 4A and FIG. 4B is a section view of a production step at the time when bumps are formed at other portion than the cutting portion of the scribing line area;

FIG. 5 is a section view of a structure in which a metal layer of Al or the like is formed, instead of a bump, at the scribing line area;

FIG. 6A is a plan view of a semiconductor element of which periphery is surrounded by an electrode, and FIG. 6B is a perspective view thereof;

FIG. 7 is a perspective view of main portions of a semiconductor element in which the peripheral electrode is connected to one of inside electrodes;

FIG. 8 is a perspective view of main portions of a semiconductor element in which there are breaks in the peripheral electrode;

FIG. 9A is a perspective view of a semiconductor element in which the peripheral bump is connected to one of the inside bumps, FIG. 9B is a section view taken along the line IX—IX of FIG. 9A, and FIG. 9C is a section view of a two-layer structure in which the semiconductor element in FIG. 9A is combined with another semiconductor element;

FIG. 10A is a perspective view of a step of forming a bump also on all lateral sides of a semiconductor element having a peripheral bump, and FIG. 10B is a section view of FIG. 10A;

FIG. 11 is a section view of a semiconductor element having a peripheral electrode, which is provided on all lateral sides thereof with a bump and on the underside thereof with a bump; and FIG. 12A is a perspective view of a step of bonding, to each other, semiconductor elements each having a peripheral bump, thereby to form a so-called chip-on-chip two-layer structure, and FIG. 12B is a section view of the structure thus obtained.

DESCRIPTION OF THE PREFERRED EMBODIMENTS

The following description will be made on the assumption that an Si semiconductor is used as the semiconductor type, but it is a matter of course that a GaAs or Ge semiconductor or other type of semiconductor may also be used.

Figure 1:
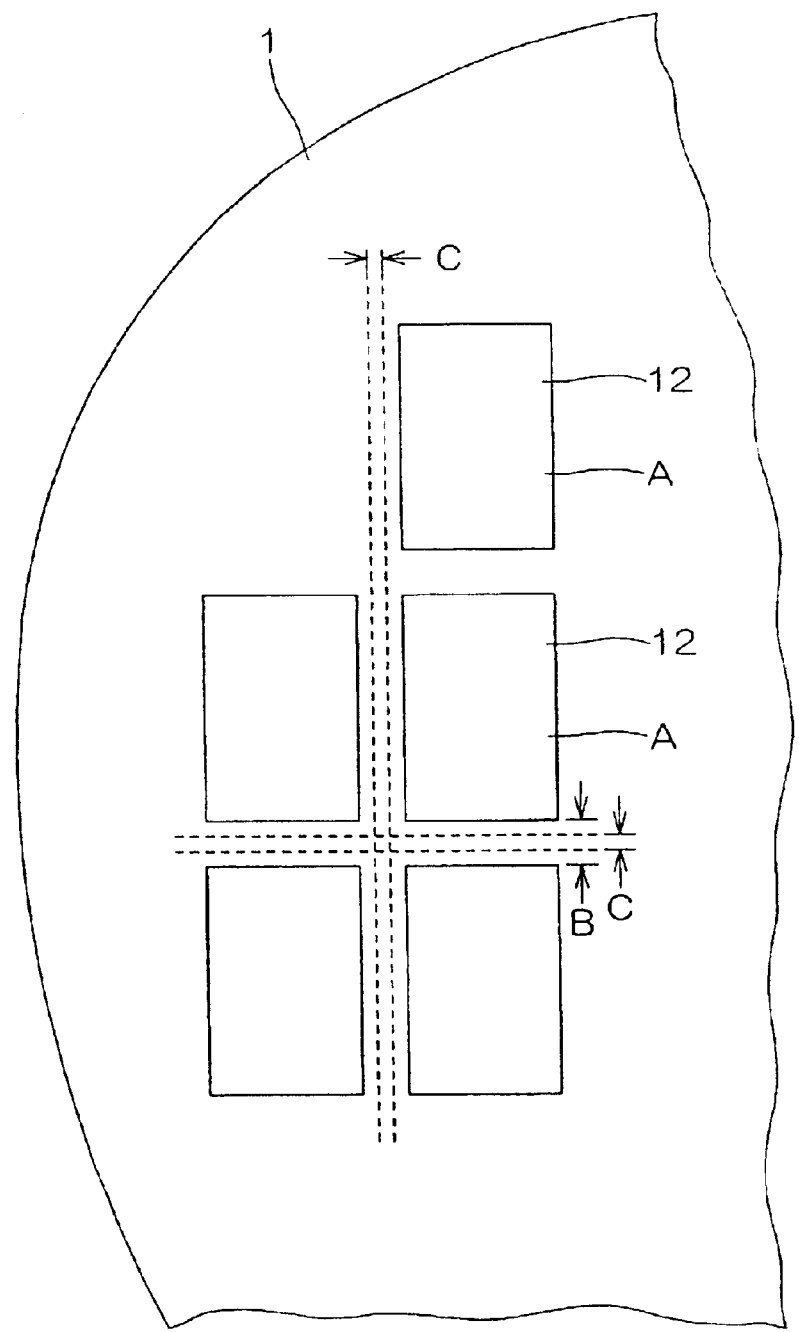
FIG. 1 is a schematic plan view of a semiconductor substrate.

FIG. 1 is a plan view of an Si semiconductor substrate 1. Arranged on the Si semiconductor substrate 1 are a number of semiconductor elements 12 to be cut into individual chips. Also arranged on the Si semiconductor substrate 1 are a plurality of element forming areas A respectively corresponding to a plurality of semiconductor elements 12. Scribing line areas B serving as allowances to be cut are formed between adjacent element forming areas A. The portions to be actually cut are generally designated by C.

Each of FIG. 2A to FIG. 2F is a section view of an element forming area A at its peripheral portion for illustrating a bump forming step.

Figure 2A:
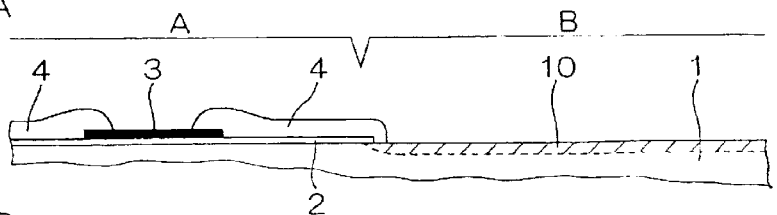

As shown in FIG. 2A, an Al electrode 3 is formed at a predetermined position of the element forming area A of the Si semiconductor substrate 1 with an $SiO_2$ film 2 interposed therebetween. A passivation film 4 of SiN, PSG or the like covers other portion of the element forming area A than the Al electrode 3. To assure ohmic contact or insulation, a high-concentration impurity 10 of a predetermined conduction type, is implanted into a scribing line area B. The conduction type of the impurity 10 is identical with that of the substrate 1 when it is intended to assure ohmic contact, and is different from that of the substrate 1 when it is intended to assure insulation. A metal layer of Al or the like may be evaporated on the impurity 10.

Figure 2B:
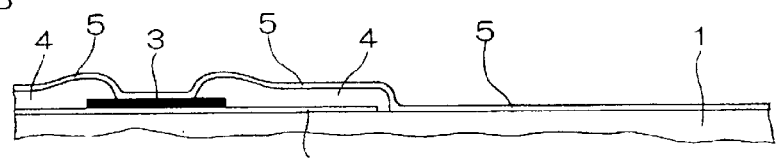

On the element forming area A and the scribing line area B, there are evaporated, in lamination, first a TiW alloy layer (barrier metal layer, not shown) for enhancing the adhesion between the Al electrode and a bump, and then a seed layer 5 of Au, Pt or the like for electrical supply, by a method of sputtering or the like (FIG. 2B).

Figure 2C:
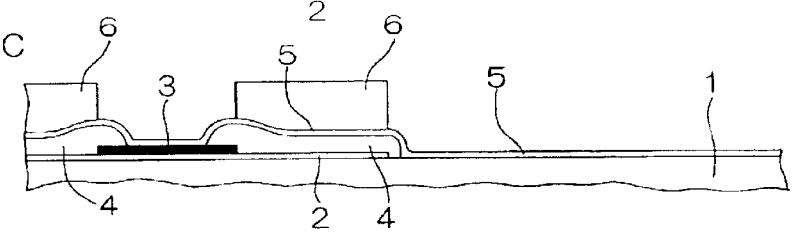

Then, a photoresist 6 is applied onto the substrate 1, and punching for bump plating is conducted at the electrode portion and the scribing line area (FIG. 2C).

Figure 2D:
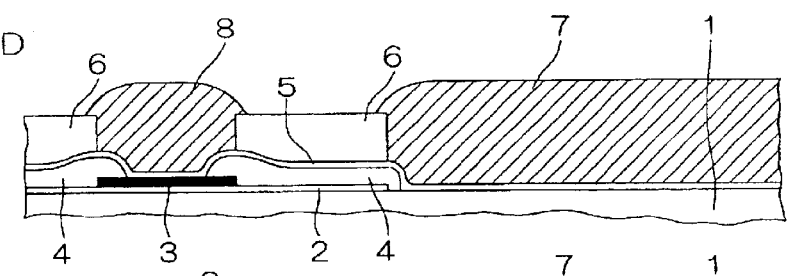

Then, the substrate 1 is plated thick with bump metal by an electrolytic plating method (FIG. 2D). Examples of the bump metal include a non-oxidizable metal such as Au, Pd, Pt, Ag, Ir(iridium) or the like. Out of the bumps thus formed, the bump formed on the Al electrode 3 is generally designated by a reference numeral 8, and the bump formed around the semiconductor element 12 is generally designated by a reference numeral 7.

Figure 2E:
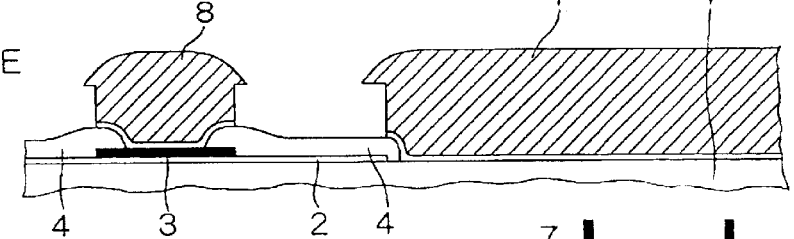
Figure 2F:
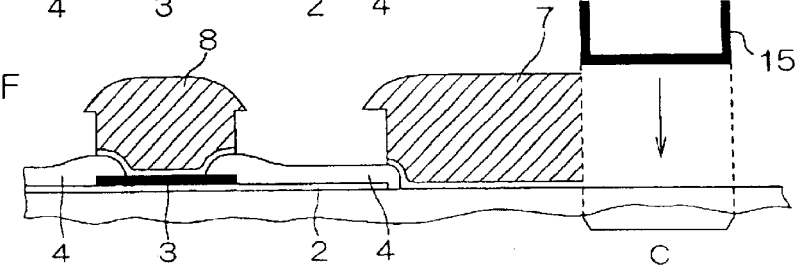

Then, the photoresist 6 is removed, and the surface seed layer 5 and the barrier metal layer on the resultant surface are then removed (FIG. 2E). Then, a portion to be cut C of the scribing line area B is cut with a cutter 15 (FIG. 2F), thus obtaining a semiconductor element 12 cut as an individual chip.

Each of FIG. 3A to FIG. 3C is a view of a production step which adopts electroless plating for forming bumps.

As shown in FIG. 3A, an Al electrode 3 is formed at a predetermined position of an element forming area A of a Si semiconductor substrate 1 with an $SiO_2$ film 2 interposed therebetween. A passivation film 4 covers other portion of the element forming area A than the Al electrode 3. Likewise in the structure shown in FIG. 2A to FIG. 2F, to assure ohmic contact or insulation, a high-concentration impurity 10 of a predetermined conduction type is implanted into a stress-relaxing-bump forming area.

On the surface of the substrate 1, a barrier metal layer(not shown) and a seed layer 5a are laminated.

Then, a photoresist 6 is applied onto the substrate 1, and predetermined portions are punched. Then, the substrate 1 is plated thick with bump metal by an electroless plating method (FIG. 3B). This electroless plating is a metal plating film-forming method utilizing a reduction action by a chemical reaction. Then, the photoresist 6 is removed, and the seed layer 5 on the resultant surface is then removed. Then, a portion to be cut C of the scribing line area of the semiconductor substrate 1, is cut with a cutter 15 (FIG. 3C), thus obtaining a semiconductor element 12 cut as an individual chip.

Each of FIG. 4A and FIG. 4B is a section view of a semiconductor substrate in which the bump 7 is not formed at the portion to be cut C in the scribing line area B. To prevent the bump 7 from growing on the portion to be cut C, the portion to be cut C may be covered with a resist before the step of FIG. 2D or FIG. 3B.

In the structure in FIG. 4A and FIG. 4B, no bump has originally been formed at the portion to be cut C. Accordingly, when cutting the portion to be cut C with the cutter 15, it is advantageous in that chip cutting is facilitated and that the cutter 15 is prevented from getting clogged with the bump metal.

FIG. 5 is a section view of a semiconductor substrate in which a metal layer 11 of Al or the like is formed, instead of the bump, on the scribing line area B. For example, the metal layer 11 may simultaneously be formed at the step of forming the Al electrode 3 on the element forming area A (See Japanese Patent Laid-Open Publication (KOKAI) Number 5-304154). In this case, too, the portion to be cut C of the scribing line area B on the Si semiconductor substrate 1 is cut with the cutter 15 to obtain a semiconductor element 12 cut as an individual chip.

The semiconductor element 12 produced by any of the methods shown in FIG. 2A to FIG. 2F, FIG. 3A to FIG. 3C, FIG. 4A to FIG. 4B, and FIG. 5, is provided on the top thereof with surface electrodes (hereinafter referred to as inside electrodes) 14 and at the periphery thereof with an electrode (hereinafter referred to as peripheral electrode) 13 as shown in FIGS. 6A and 6B.

Each of the inside electrodes 14 may be the bump 8 or the Al electrode shown in any of FIG. 2A to FIG. 2F, FIG. 3A to FIG. 3C, and FIG. 4A to FIG.4B. The peripheral electrode 13 may be the bump 7 shown in any of FIG. 2A to FIG. 2F, FIG. 3A to FIG. 3C, and FIG. 4A to FIG. 4B, or may be the metal layer 11 shown in FIG. 5.

As an example of utilization of the peripheral electrode 13, the peripheral electrode 13 may be connected to one of the inside electrodes 14 as shown in FIG. 7. More specifically, the peripheral electrode 13 can be connected in any of the following manners (1) to (3).

(1) When the peripheral electrode 13 is connected to the grounding inside-electrode 14, the periphery of the semiconductor element 12 can be grounded. Further, by utilizing the peripheral electrode 13 as the grounding line, other inside electrode 14 may also readily be grounded. In particular, when the peripheral electrode 13 is formed by a bump, the low resistance properties of the thick bump can be utilized to assure good grounding.

(2) When the peripheral electrode 13 is connected to the power-supply inside-electrode 14, the peripheral electrode 13 can be used as the power supply line. Thus, other inside electrode 14 may also readily be connected to the power supply. In particular, when the peripheral electrode 13 is formed by a bump, the low resistance properties of the thick bump can be utilized to assure efficient feed of the power supply.

(3) As shown in FIG. 8, breaks D can be formed in the, peripheral electrode 13 to form two peripheral electrodes 13a, 13b. One peripheral electrode 13a can be connected to the grounding, while the other peripheral electrode 13b can be connected to the power supply. This improves the degree of freedom for wiring of the inside electrodes 14.

The following description will be made on the assumption that each of the inside electrodes 14 is the bump 8 shown in FIG. 2A to FIG. 2F, FIG. 3A to FIG. 3C, or FIG. 4A to FIG. 4B, and that the peripheral electrode 13 is the bump 7 shown in FIG. 2A to FIG. 2F, FIG. 3A to FIG. 3C, or FIG. 4A (hereinafter respectively referred to as the inside bump 8 and the peripheral bump 7).

FIG. 9A is a perspective view of a semiconductor element in which the peripheral bump 7 (peripheral electrode) is connected to one of the inside bumps 8 (surface electrodes), and FIG. 9B is a section view taken along the line IX—IX of FIG. 9A. A connection bump 9 (connection metal layer) serves as a connection line for connecting the inside bump 8 to the peripheral bump 7. The height H of the connection bump 9 is not necessarily the same as that of the inside bump 8 or the peripheral bump 7, but may be lower. In particular, when two semiconductor elements 12 are combined with each other in a so-called chip-on-chip two-layer structure as shown in FIG. 9C, or when the semiconductor element 12 is connected to the inner lead side of a TAB (Tape Automated Bonding), the height H of the connection bump 9 is required to be low to prevent the undesired contact of the connection bump 9.

FIG. 10A is a perspective view of a step of forming a bump 7a (lateral-wall metal layer) also on all lateral sides of the semiconductor element 12 having the peripheral bump 7, and FIG. 10B is a section view of FIG. 10A. In this semiconduct or element 12 having the bump 7a also on the lateral sides, when the peripheral bump 7 is grounded, the grounding effect is given to the lateral sides of the semiconductor element 12. Thus, the semiconductor element 12 can be shielded in a better manner.

FIG. 11 is a section view of a semiconductor element 12 having a peripheral bump 7, which is provided on the underside thereof with a bump 7b (back-face metal layer), in addition to a bump 7a on all lateral sides. When the bump 7b is formed also on the underside, the semiconductor element 12 can perfectly be shielded.

Each of FIG. 12A and FIG. 12B is a view illustrating how to form a so-called chip-on-chip two-layer structure by combining, with each other, two semiconductor elements 12 each having a peripheral bump 7. FIG. 12A is a perspective view of a step of bonding the semiconductor elements 12 to each other, and FIG. 12B is a section view of the structure obtained by bonding the semiconductor elements 12 to each other. In the semiconductor elements 12 to be bonded to each other, their surface structures are similar to each other, but their entire structures and inside structures are not always the same.

In this chip-on-chip structure, the peripheral bumps 7 are bonded to each other to form a perfectly shielded structure, thus forming a semiconductor device highly resistant against electrostatic induction. Further, when bonding the inside bumps 8 of one semiconductor element 12 to the inside bumps 8 of the other semiconductor element 12, the peripheral bumps 7 large in area are bonded to each other to relax the shock produced when the inside bumps 8 are bonded to each other.

In FIG. 12A and FIG. 12B, when a TAB pattern film is used instead of one semiconductor element 12, too, similar shielding and shock-absorbing effects can be expected.

The present invention should not be limited to the embodiments above-mentioned. For example, the peripheral electrode 13 or the peripheral bump 7 has been formed at the entire periphery of the semiconductor element 12, but may be formed at a portion of the periphery.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This application claims priority benefits under 35 USC §119 of Japanese Patent Application Serial No. 11-25910, filed on Feb. 3, 1999, the disclosure of which is incorporated herein by reference.

What is claimed is:

1. A method of manufacturing chip-on-chip structure that includes first and second semiconductor devices, each having an exposed surface for contacting the semiconductor device, comprising the steps of:

forming the first and second semiconductor devices, the first semiconductor device being formed by the steps of
providing a plurality of element forming areas on a semiconductor substrate,
forming a metal layer in a form of a bump at scribing line areas between adjacent element forming areas of the substrate, the metal layer, including the bump, having the exposed surface for contact with a bump of the second semiconductor device, and
cutting the semiconductor substrate along cutting areas in said scribing line areas to obtain the first semiconductor device; and mating the exposed surfaces of the first and second semiconductor devices with each other, so that the bumps of the first and second semiconductor devices contact with each other.

2. A method according to claim 1, wherein said metal-layer forming step includes a step of forming said metal layer at areas of said scribing line areas other than said cutting areas.

3. A method according to claim 1, wherein said metal-layer forming step is conducted simultaneously with a step of forming a surface electrode within said element forming areas.

4. A semiconductor device manufacturing method, comprising:

a step of providing a plurality of element forming areas on a semiconductor substrate;

a step of forming a metal layer at scribing line areas between adjacent element forming areas; and a step of cutting said semiconductor substrate along cutting areas in said scribing line areas, so as to obtain a rectangularly-shaped semiconductor device having four side surfaces surrounding the element forming areas, and to expose a cut surface of the metal layer at the side surfaces, the exposed cut surface of the metal layer extending along the entirety of a length of at least one of the side surfaces;

said metal-layer forming step including a step of forming said metal layer, extending along the scribing line areas, at areas of said scribing line areas other than said cutting areas, said metal layer forming step forming the metal layer so as to extend along the cutting areas within the scribing line areas;

whereby the metal layer at the areas of the scribing line areas other than the cutting areas is left on the semiconductor substrate extending along the cutting areas, after said cutting step.

5. A method according to claim 4, wherein said metal-layer forming step is conducted simultaneously with a step of forming a surface electrode within said element forming areas.

* * * * *